United States Patent
Sakui et al.

(10) Patent No.: US 6,240,022 B1
(45) Date of Patent: *May 29, 2001

(54) NON-VOLATILE SEMICONDUCTOR MEMORY DEVICE WITH BLOCK ERASE FUNCTION

(75) Inventors: Koji Sakui, Tokyo; Hiroshi Nakamura, Kawasaki; Toshihiko Himeno; Junichi Miyamoto, both of Yokohama, all of (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/055,215

(22) Filed: Apr. 6, 1998

Related U.S. Application Data

(63) Continuation of application No. 08/631,049, filed on Apr. 12, 1996, now Pat. No. 5,818,756.

(30) Foreign Application Priority Data

Apr. 17, 1995 (JP) .................................................. 7-090420

(51) Int. Cl.⁷ .................................................. G11C 16/04
(52) U.S. Cl. .............................. 365/185.29; 365/185.27; 365/185.11
(58) Field of Search .......................... 365/185.17, 185.11, 365/185.29, 218, 230.03, 185.27

(56) References Cited

U.S. PATENT DOCUMENTS

| 5,357,462 | 10/1994 | Tanaka et al. .............. 365/185.17 X |
| 5,400,287 | 3/1995 | Fuchigami .......................... 365/218 |
| 5,568,420 | 10/1996 | Lim et al. ....................... 365/185.17 |
| 5,568,421 | 10/1996 | Aritome .......................... 365/185.17 |
| 5,818,756 | * 10/1998 | Sakui et al. ..................... 365/185.17 |

FOREIGN PATENT DOCUMENTS

| 0 608 075 A2 | 7/1994 | (EP) . |
| WO 94/28554 | 12/1994 | (WO) . |

OTHER PUBLICATIONS

"A Quick Intelligent Page–Programming Architecture and A Shielded Bitline Sensing Mthod for 3V–Only NAND Flash Memory" in IEEE Journal of Solid–State Circuits, vol. 29, No. 11, Nov. 1994.

* cited by examiner

Primary Examiner—A. Zarabian
(74) Attorney, Agent, or Firm—Banner & Witcoff, Ltd.

(57) ABSTRACT

At the time of erasing data, common gate lines connected to selective gates are charged with Vcc or a voltage higher than. This enables reliable cut-off of transfer transistors at the time of erasing data. Accordingly, even if the potential of the selective gates increase in accordance with an increase in the substrate potential of a memory cell portion, current leakage through the transistors can be prevented. Further, at the time of erasing data, the common gate lines are set to $V_L$ slightly higher than Vss. This can enhance the cut-off characteristics of transfer transistors in a non-selected block, and prevent erroneous erasion of data stored in memory cells included in the non-selected block.

30 Claims, 8 Drawing Sheets

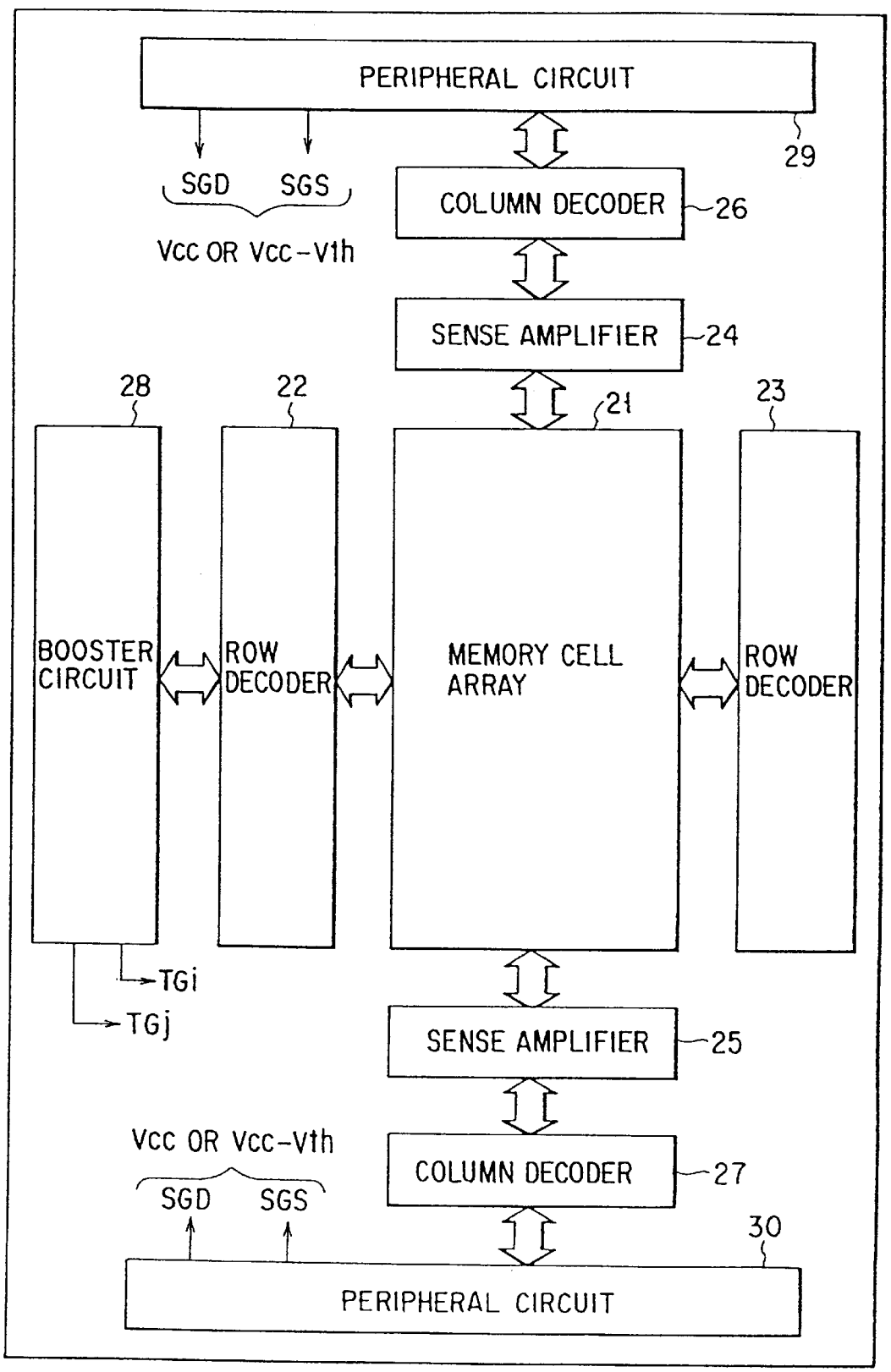
F I G. 1

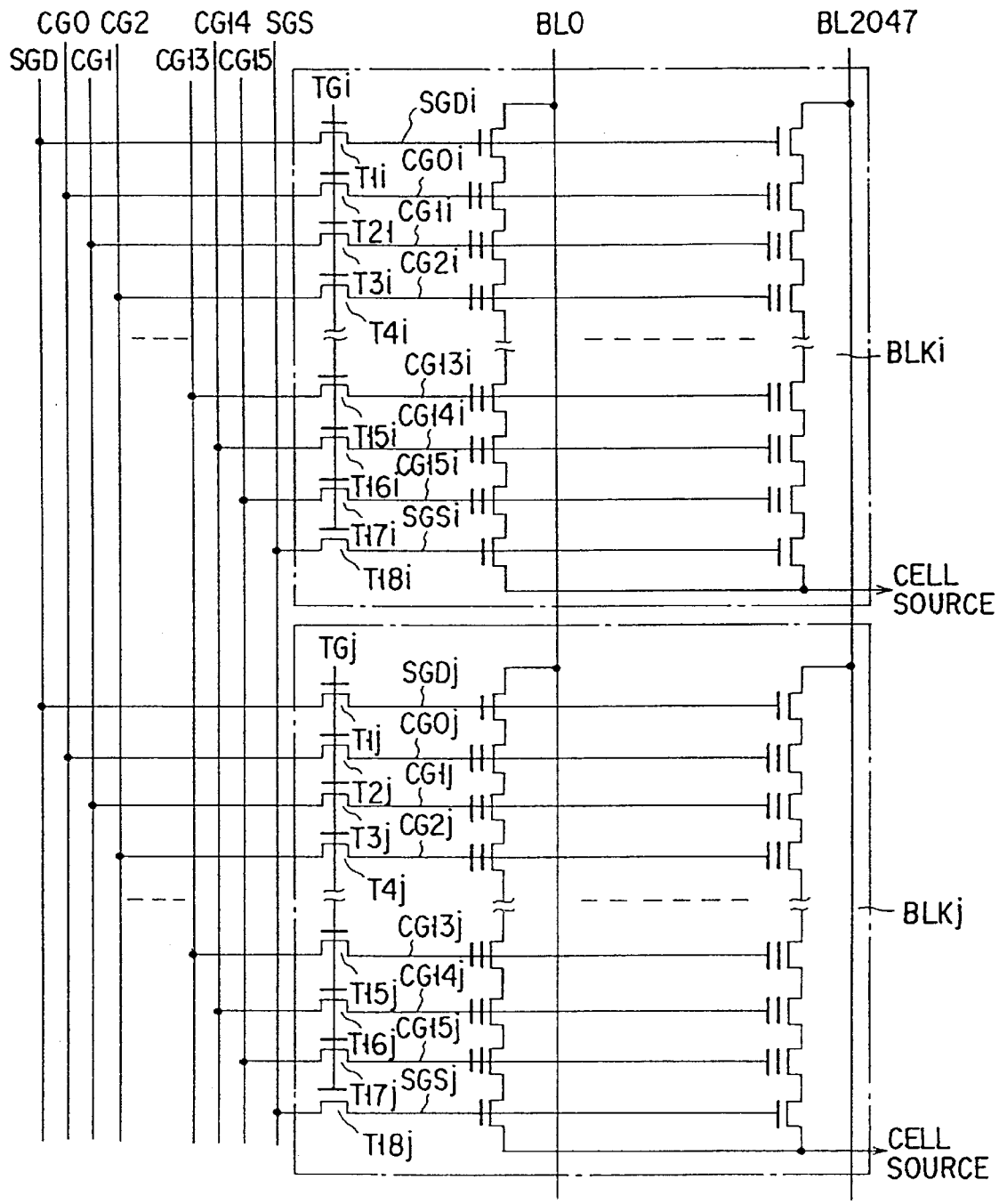
F I G. 2

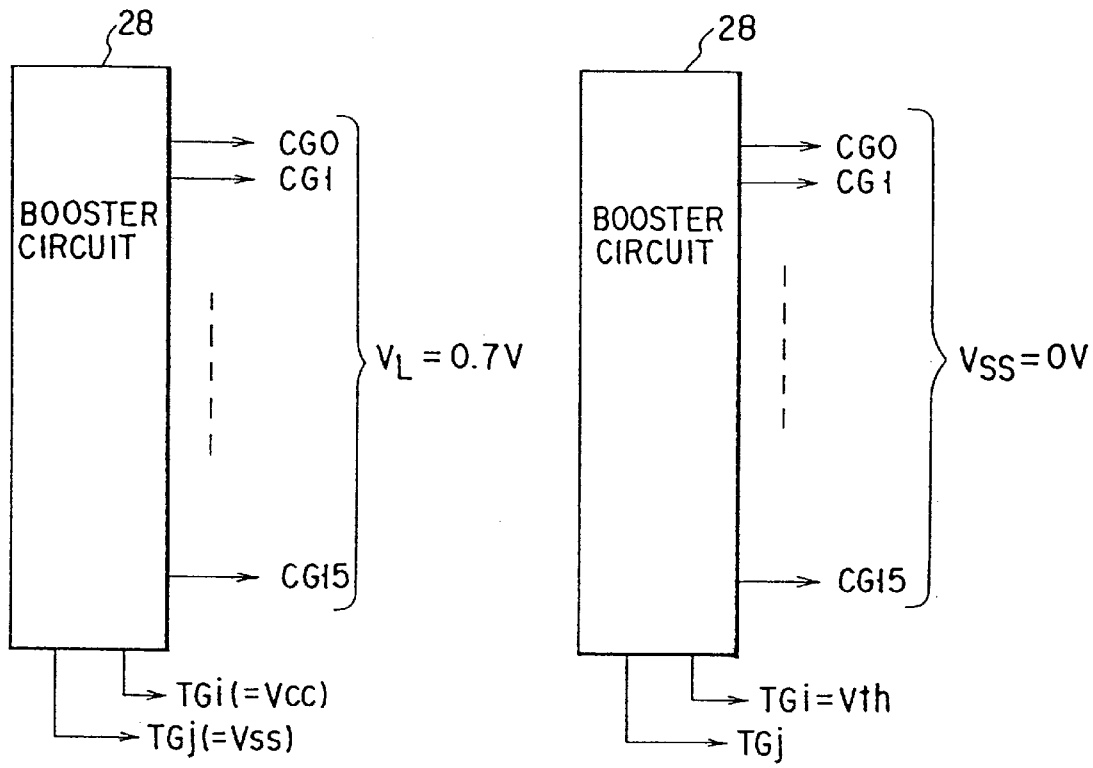
FIG. 3A
FIG. 4
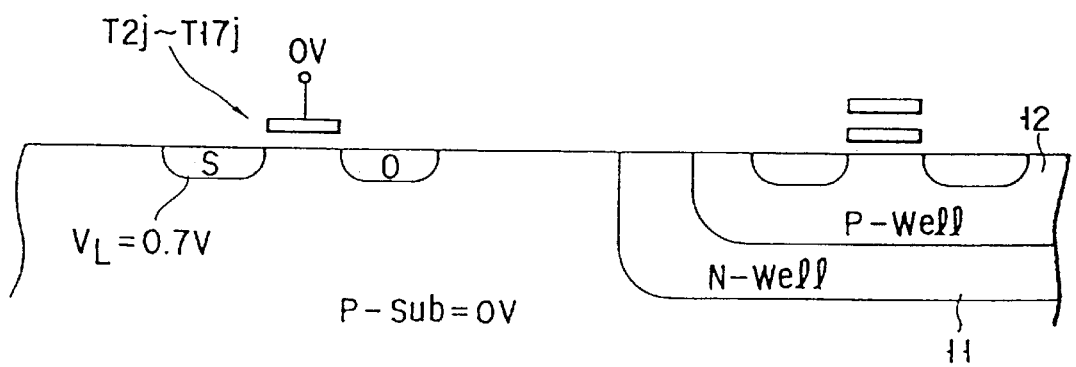
FIG. 3B

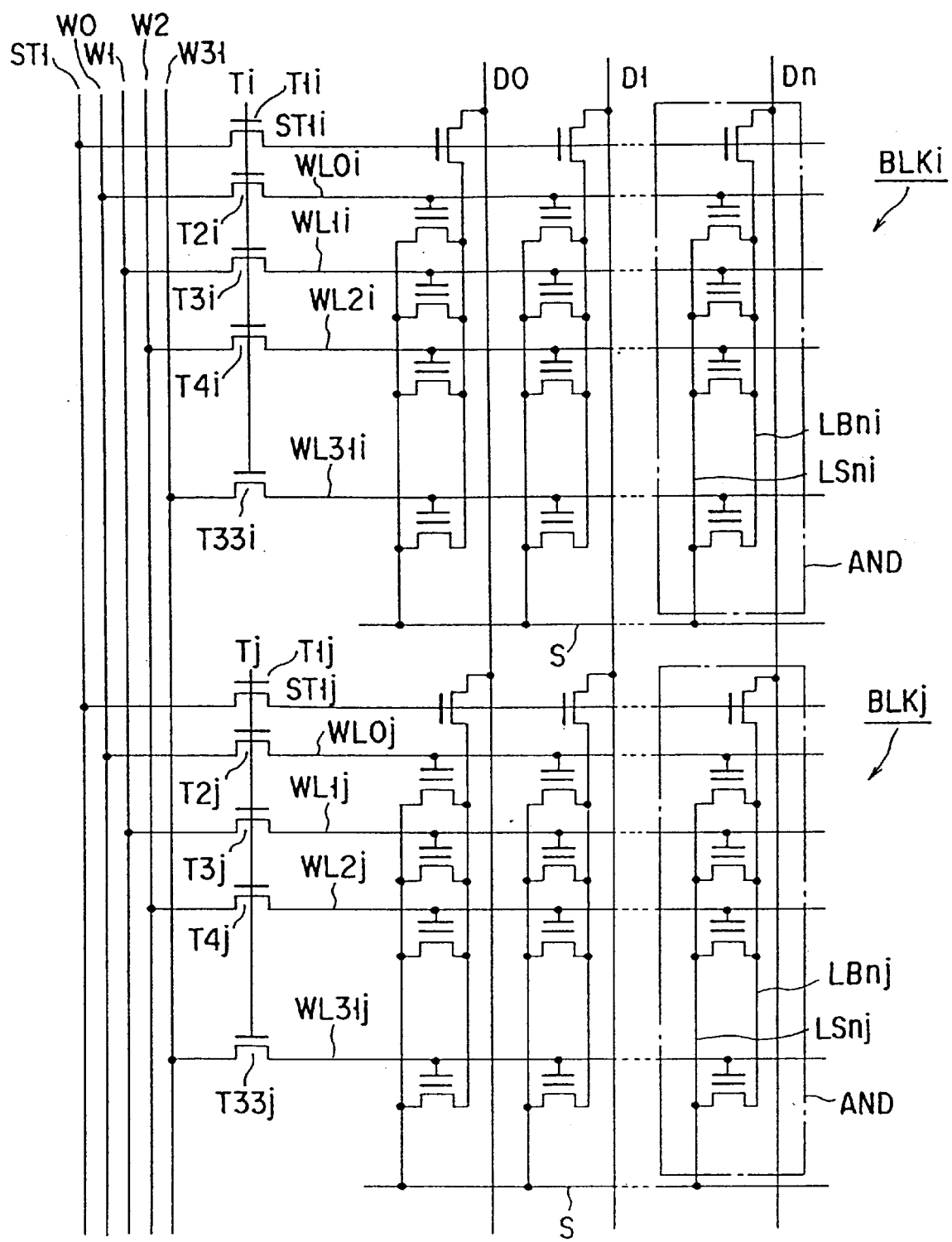
F I G. 6

NON-VOLATILE SEMICONDUCTOR MEMORY DEVICE WITH BLOCK ERASE FUNCTION

This application is a continuation of Ser. No. 08/631,049, filed Apr. 12, 1996, U.S. Pat. No. 5,818,756.

BACKGROUND OF THE INVENTION

1. Field of the Invention

This invention relates to a non-volatile semiconductor memory device which consists of memory cell units, such as NAND cells, AND cells, DINOR cells, etc., each formed of a plurality of memory cells connected to each other.

2. Description of the Related Art

An electrically erasable programmable EEPROM is known as a conventional non-volatile semiconductor memory device. In particular, attention has been paid to a NAND-cell type EEPROM consisting of a plurality of EEPROMs connected in series, since it is suitable to high integration.

Each memory cell (i.e. EEPROM) included in the NAND-cell type EEPROM has a FETMOS structure wherein a floating gate (a charged layer) and a control gate are provided on a semiconductor substrate with an insulating film interposed therebetween. Each NAND cell is constituted by a plurality of memory cells connected in series to each other. Each adjacent pair of the memory cells commonly use a single source and a single drain. A memory cell array is constituted by a plurality of NAND cells constructed as above and arranged in the form of a matrix.

The drains of NAND cells arranged in columns in the memory cell array are each located at an end of a corresponding NAND cell, and are commonly connected to a corresponding bit line via a corresponding selective gate transistor. On the other hand, the sources of the NAND cells arranged in columns are each located at the other end of a corresponding NAND cell, and are commonly connected to a common source line. The control gate of each memory transistor is connected to a corresponding one of control gate (word) lines arranged in rows in the memory cell array. The gate electrode of each selective gate transistor is connected to a corresponding one of selective gate lines arranged in rows in the memory cell array.

FIG. 7 is a plan view, showing a basic structure of each NAND cell formed of EEPROMs, while FIGS. 8A and 8B are sectional views, showing the structure. FIG. 9 shows a circuit equivalent to the NAND cell shown in FIG. 7. In this example, the NAND cell is constituted by connecting, in series, four memory cells M1–M4, two selective MOS transistors S1 and S2, and its source and drain diffusion layers. A plurality of NAND cells constructed as above constitute a memory cell array.

The drain of the memory cell M1 is connected to a bit line BL via a selective line S1. The source of the memory cell M4 is connected to a source line via a selective transistor S2. The control gates $6_1$–$6_4$ (CG1–CG4) of the memory cells M1–M4 are connected to a word line WL which intersects the bit line BL. Although in this case, each NAND cell consists of four memory cells, it can be formed of a number $2^n$ of memory cells.

The cell structure will be explained in more detail with reference to FIGS. 8A and 8B. An n-well 11 is formed on a p-type silicon substrate 10, and a p-well 12 is formed on the n-well 11. Memory cells are formed on the p-well 12, and a peripheral circuit is provided in a region of the p-well other than the region of the same in which the memory cells are provided. The region in which the NAND cell is formed is defined by an element-separating insulation film 13.

Each memory cell comprises a first gate insulation film $3_1$ consisting of a thermally oxidized film with a thickness of 5–20 nm formed on the p-well 12; a floating gate 4 ($4_1$, $4_2$, $4_3$, $4_4$) consisting of a first polycrystal silicon film with a thickness of 50–400 nm formed on the first gate insulation film $3_1$; a second gate insulation film 5 consisting of a thermally oxidized film with a thickness of 15–40 nm formed on the floating gate 4; and a control gate 6 ($6_1$, $6_2$, $6_3$, $6_4$) consisting of a second polycrystal silicon film with a thickness of 100–400 nm formed on the second gate insulation film 5. The control gates 6 are continuously arranged in one direction and serve as a single word line WL.

An n-type layer 9 which serves as a source/drain diffusion layer is commonly used by each adjacent pair of the memory cells. The drain of the NAND cell, which is located at an end thereof, is connected to a bit line 8 via the selective MOS transistor S1 formed of a gate electrode $4_5$. The source of the NAND cell, which is located at the other end thereof, is grounded via the selective transistor S2 formed of the gate electrode $4_6$.

The two selective transistors S1 and S2 are provided by respectively forming, on the p-well 12, selective gates 4 ($4_5$, $4_6$) consisting of the first polycrystal silicon film, with a third gate insulation film 32 consisting of a thermal oxide film with a thickness of 25–40 nm interposed therebetween. On the selective gates 4 ($4_5$, $4_6$), the lines 6 ($6_5$, $6_6$) consisting of the second polycrystal silicon film are provided, with the second gate insulation film 5 interposed therebetween. The selective gates $4_5$ and $4_6$ are connected to the lines $6_5$, $6_6$, respectively, via through holes (not shown) formed at regular intervals, thereby reducing the resistance of each line.

The floating gates $4_1$–$4_4$, the control gates $6_1$–$6_4$, the selective gates $4_5$ and $4_6$, and the lines $6_5$ and $6_6$ formed on the selective gates of all memory cells are simultaneously patterned using a single etching mask in the direction of channel length, thereby aligning the edges of the memory cells. The n-type layer 9 which serves as the source/drain diffusion layer is formed by injecting arsenic or phosphorus ions using, as masks, the control gates $6_1$–$6_4$ and the wires $6_5$ and $6_6$ on the selective gates.

In the above-described structure, the coupling capacity $C_1$ between the floating gate 4 of each memory cell and the substrate 10 is set smaller than the coupling capacity $C_2$ between the floating gate 4 and the control gate 6 of each memory cell. This will be explained using specific cell parameters. In accordance with the rule of a pattern size of 0.6 µm, the floating gate and the control gate each have a width of 0.6 µm, and those opposite end portions of each floating gate 4 which have a length of 0.6 µm are provided on each adjacent pair of element-separating insulation films 13. Further, the first gate insulation film $3_1$ is formed of a thermal oxide film with a thickness of e.g. 10 nm, and the second insulation film 5 is formed of a thermal oxide film with a thickness of e.g. 28 nm. In this case, the following equations are established:

$$C_1 = \epsilon/0.01$$

$$C_2 = 3\epsilon/0.028$$

where ε represents the dielectric constant of each thermal oxide film.

Accordingly, $C_1$ is smaller than $C_2$.

FIG. 10 shows a circuit using a NAND cell. The following table 1 shows the relationship between the potentials of the gates, for explaining the erase, write and read operations of the circuit shown in FIG. 10.

TABLE 1

|  | FLASH ERASE | SELECTIVE WRITE ($M_4$) | READ ($M_4$) |
|---|---|---|---|
| BL1 | $V_{PP}{'}$ | 0V | 1–5V |
| BL2 | $V_{PP}{'}$ | $V_{CC}$ | 0V |
| SOURCE | $V_{PP}{'}$ | 0V | 0V |
| SG1 | $V_{PP}{'}$ | $V_{CC}$ | $V_{CC}$ |
| SG2 | $V_{PP}{'}$ | 0V | $V_{CC}$ |
| CG1 | 0V | 1/2 $V_{PP}$ | $V_{CC}$ |
| CG2 | 0V | 1/2 $V_{PP}$ | $V_{CC}$ |
| CG3 | 0V | 1/2 $V_{PP}$ | $V_{CC}$ |
| CG4 | 0V | $V_{PP}$ | 0V |
| P WELL | $V_{PP}{'}$ | 0V | 0V |
| N WELL | $V_{PP}{'}$ | 0V | 0V |

First, an explanation will be given of flash erasion of data stored in all memory cells of the NAND cell ("flash erasion" means to erase all data at a time). In this example, the control gates CG1–CG4 of all memory cells of each NAND cell are set at 0 V, the gates SG1 and SG2 of the selective MOS transistors S11 and S21, the n-well 11 and the p-well 12 which surrounds the memory cells at "H" level (e.g. at a booster voltage Vpp1=18 V), and the bit lines BL1 and BL2 at Vpp1, too. As a result, an electric field occurs between the control gates of all memory cells and the p-well 12, and electrons flow from the floating gates 4 of the memory cells to the p-well 12 because of a tunnel effect. The erase operation shifts the threshold voltage of all memory cells M1–M4 to a negative value (−1—−5 V). This state will be called a data "1" state (resulting from flash erasion).

An explanation will be given of writing data into the NAND cell. To write data into only the memory cell M4 located on the side of the bit line BL1, the gate SG1 of the selective transistor S11 on the side of the bit line BL1 is set to Vcc (e.g. 5 V), the gate SG2 of the selective transistor S21 on the side of the source line to 0 V, the control gate CG4 to "H" level (e.g. a booster voltage Vpp=12–20 V), and the other control gates CG1–CG3 to an intermediate voltage (e.g. ½ Vpp) between 0 V and the "H" level.

At this time, the bit line BL1 is set to 0 V, and the bit line BL2 to Vcc (e.g. 5 V). In this state, a high electric field is generated between the control gate of the memory cell M1, the n-type diffusion layer 9, and the p-well 12, and hence electrons flow from the p-well 12 and the n-type diffusion layer 9 to the floating gate of the memory cell M1 because of a tunnel effect. As a result, the memory cell M1 is shifted to a data "0" state, wherein the threshold voltage thereof is shifted to a positive value higher than 0 V. At this time, as regards non-selected memory cells (M5–M8), the channel voltage increases from Vcc–Vth (Vth represents the threshold voltage of the selective transistor S12) to about ½ Vpp as a result of capacitive coupling, when the control gates CG1–CG3 have increased from 0 V to ½ Vpp and the control gate CG4 has increased from 0 V to Vpp. At this time, the selective transistor S12 is cut off, and the channel of each non-selected memory cell is in a floating state. Accordingly, the threshold voltage of each non-selected memory cell is kept unchanged.

As regards the memory cells M1–M3 on the side of the bit line BL1, the control gate of each of them is set at Vpp/2, and the n-type diffusion layer 9 at 0 V. Therefore, these memory cells are in the write mode. However, the electric field therebetween is not strong, and accordingly no electrons flow into the floating gates of the memory cells M1–M3. Thus, these memory cells have their threshold voltage kept unchanged, and hence are kept in the data "1" state. Moreover, on the side of the non-selected bit line BL2, the control gates CG1–CG3 of the memory cells M5–M7 are set at the intermediate voltage Vpp/2, and the source, drain and channel of each of the memory cells are substantially set at Vpp/2. Accordingly, almost no electric field occurs between the floating gates of the memory cells and the diffusion layer 9, and no electrons flow into or from the floating gates. Thus, the threshold of the memory cells is kept unchanged, and the memory cells are kept in the data "1" state. In addition, since the memory cell M8 connected to the bit line BL2 has its control gate CG4 set at the "H" level (Vpp), and the source, drain and channel thereof are substantially set at Vpp/2, the memory cell M8 is in the write mode. Since, however, the electric field generated at the memory cell M8 is not strong, no electrons flow into its floating gate, with the result that its threshold voltage is kept unchanged and the memory cell is in the data "1" state.

As explained above, data is written into the memory cell M4 only.

An explanation will then be given of the case where data is written into the memory cell M3 of the NAND cell located next to the memory cell M4. In this case, the control gate CG3 of the memory cell M3 is increased to the "H" level (Vpp), the control gates CG1, CG2 and CG4 of the memory cells M1, M2 and M4 are set to the intermediate voltage Vpp/2. Further, the bit line BL1 on the side of the selected memory cell M3 is set to 0 V, and the other bit line BL2 to Vcc (e.g. 5 V). The two selective gates S11 and S12 have their gate voltages set to values identical to those employed in the case of writing data into the memory cell M4. As a result, data can be written into the memory cell M3. Similarly, data are sequentially written into the memory cells M2 and M1.

Although in the above-described writing, the "H" level (Vpp) voltage or the intermediate level (Vpp/2) voltage is applied to the control gate of each memory cell, the current which flows from each control gate (at the "H" level or the intermediate level) is of 10 μA or less, since the current is the sum of a tunnel current and a junction leak current between the diffusion layer 9 and the p-well 12. Moreover, although at the time of flash erasion, the n-well 11 and the p-well 12 which surrounds the memory cells is increased to the "H" (Vpp1) level, the current which flows from the control gate at the "H" level is of 10 μA or less, since the current is the sum of the tunnel current and a junction leak current between the n-well 11 and the p-type substrate 10.

Thus, a high voltage applied at the time of write and erase operations can be created by the booster circuit using even a low voltage of about 5 V applied from the outside to the IC. Further, since only a small amount of current flows, during writing, from the control gate at the high level, data can be written, at a time, into all memory cells connected to a single control gate. In other words, write can be performed in a "page mode", which contributes to high-speed write.

In addition, since in the above-described write and erase operations, no surface breakage occurs between the drain portion of each memory cell and the p-well while the tunnel current flows, the number of occasions where data can be rewritten can be increased, and the reliability of data storage can be enhanced. Also, since only a low voltage of about Vcc (e.g. 5 V) is applied to the gate electrode GS of each selective gate and to the non-selected bit line, separation of elements can easily be performed, and the element separation width can be set to a low value substantially equal to that employed in the conventional hot electron injection type EEPROM.

The manner of reading data, for example, from the memory cell M4 will now be explained. At the time of read, the power voltage Vcc (5 V) is applied to the two selective transistors SG1 and SG2 to turn them on. An "H" level (e.g. 5 V) voltage which can turn on a memory cell in the data-written state is applied to the control gates CG1, CG2 and CG3 of the non-selected memory cells M1, M2 and M3. The control gate CG4 of the selected memory cell M4 is set to an "L" level voltage (e.g. 0 V).

The bit line BL1 is set to an "H" level voltage (about 1–5 V), while the source line is set to 0 V. On the basis of whether or not a current flows through the bit line BL1, it is determined whether data read from the memory cell M4 is "1" or "0".

The above-described conventional NAND-cell type EEPROM has a block erase function for erasing only data stored in a selected block, and also a multi-block erase function for erasing only data stored in at least two selected blocks, as well as the chip erase function for flash-erasing data stored in all memory cells at a time.

FIG. 11 is a view, useful in explaining block erasion or multi-block erasion. Table 2 shows the relationship in potential between gates.

TABLE 2

|  | BLOCK ERASE |
| --- | --- |
| BL0 | $V_{PP}$ |
| . | . |
| . | . |
| . | . |
| BL2047 | $V_{PP}$ |
| Cell-Source | $V_{PP}$ |
| SGD | $V_{SS}$ FLOATING |
| CG0 | $V_{SS}$ (0V) |
| CG1 | $V_{SS}$ (0V) |
| CG2 | $V_{SS}$ (0V) |
| CG3 | $V_{SS}$ (0V) |
| SGS | $V_{SS}$ FLOATING |
| TGi | $V_{SS}$ (5V) |
| TGj | $V_{CC}$ (0V) |
| P WELL | $V_{PP}$ |
| N WELL | $V_{PP}$ |
| P-TYPE SUBSTRATE | $V_{SS}$ (0V) |

Specifically, FIG. 11 shows an i-th block BLKi to be erased (selected) and a j-th block BLKj not to be erased (non-selected). To perform the erase operation, common gate lines CG0–CG3 are set to Vss (0 V), and common gate lines SGD and SGS are set in a "Vss (=0 V) floating" state (in this state, the selective gate lines are first set to Vss and then shifted to a potential floating state). If the transfer gate signal TGi of the selected block BLKi is set to Vcc (5 V), transistors T1i–T6i become conductive, and control gates CG0i–CG3i are set to Vss (0 V). Thus, if the p-well and n-well in the memory cell section are set to a high voltage Vpp, data stored in the memory cells of the selected block BLKi are erased, and the memory cells are shifted to the data "1" state.

On the other hand, since the transfer gate signal TGj of the non-selected block BLKj is set at Vss (0 V), the transfer gate transistors T1j–T6j are in a non-conductive state, control gates CG0j–CG3j and selective gates SGDj and SGSj are in a floating state. Accordingly, the p-well and n-well in the memory section are set to the high voltage Vpp, the control gates CG0j–CG3j and selective gates SGDj and SGSj increase to a value substantially equal to Vpp as a result of capacitive coupling with the p-well. Accordingly, the electric field between the p-well and the floating gate of each memory cell in the non-selected block BLKj is not strong, and hence data stored therein is not erased.

The above-described conventional block erase operation has the following two problems:

The first problem lies in the potentials of the selective gates SGDi and SGSi in the selected block. If the p-well in the memory cell section is set to the high voltage Vpp at the time of block erasion, the potentials of the selective gates SGDi and SGSi of the selected block BLKi and those of the selective gates SGDj and SGSj of the non-selected block BLKj will increase as a result of capacitive coupling with the p-well. Since the transfer gate signal TGi of the selected block is Vcc (5 V) and the transfer gate transistors T1i–T6i are in a conductive state, the charges of the control gates SGDi and SGSi will flow, via the transistors T1i–T6i, to the common gate lines SGD and SGS which are in a floating state.

For example, in the case of a 16-Mbit NAND-cell type EEPROM, the capacitance of the common gate line SGD or SGS is estimated to be 7.1 PF, and the capacitance of the selective gate SGDi or SGSi is 2 PF. The potential of the selective gate SGDi or SGSi is 4.4 V under the conditions that the erase voltage Vpp is 20 V, and the threshold voltage is 0.43 V when the substrate bias of the transistor T1i or T6i is –Vcc (–5 V). Since in the case of 16 Mbits, the oxide film of the selective gate is 320 angstrom, the electric field applied to the oxide film is 4.9 MV/cm. Further, since in the case of 16 Mbits, the oxide film of the selective gate has a relatively great thickness of 320 angstrom, no problem will occur. However, in accordance with an increase in memory capacity, the oxide film of the selective gate becomes thinner. In the case, for example, of 32 Mbits, the thickness is 180 angstrom, and will be 90 angstrom in the case of 64 Mbits. Accordingly, an electric field of 10 MV/cm or more may be applied to the oxide film as the memory capacity increases, with the result that the oxide film may be seriously damaged.

The second problem lies in the transfer transistor. In light of that the fact that the high voltage Vpp is applied to the control gate of each memory cell at the time of writing data therein, the transfer transistor is set to have a low threshold voltage and a small substrate bias effect as aforementioned. For example, the transfer transistor is designed such that its threshold voltage is set to +0.21 V, +0.43 V, and +0.67 V when the substrate bias is 0 V, –5 V and –18 V, respectively. If the transistors T2j–T5j are not sufficiently cut off when the potential of the control gates CG0j–CG3j of the non-selected block BLKj increases, at the time of erasion, to Vpp as a result of capacitive coupling with the p-well, a large leak current flows through the common gate lines CG0–CG3 via the transistors T2j–T5j. Accordingly, the potential of the control gates CG0j–CG3j decreases, and data in the non-selected block BLKj are erroneously erased. Furthermore, the potential of the selective gates SGDj and SGSj decreases due to current leakage at the transistors T1j and T6j, thereby seriously damaging the oxide film of each selective gate transistor.

As explained above, since in the conventional NAND-cell type EEPROM, the potential of the selective gate line is set in a "Vss (=0 V) floating" state at the time of performing erasion in units of a block, the potential of the selective gate of a block, from which data are to be erased, is reduced, and a high voltage is applied to the oxide film of the selective gate, thereby seriously damaging the selective gate.

Further, so as to transmit a high voltage to the control gate at the time of writing, the transfer transistor has a low threshold voltage and a low substrate bias effect. Therefore, when a great amount of channel leak occurs at a transfer transistor in a non-selected block, erroneous erasion of memory cell data or breakage of the oxide film of a selective gate may well occur.

SUMMARY OF THE INVENTION

It is the object of the invention to provide a highly reliable non-volatile semiconductor device capable of preventing current flow through a transfer transistor connected to the selective gate of a selected block and through all transfer transistors of non-selected blocks, thereby preventing erroneous erasion of memory cell data and breakage of the oxide film of a transistor which constitutes the selective gate.

The object can be achieved by the following structure:

At the time of erasing data, common gate lines connected to selective gates are charged with Vcc or voltage higher than (Vcc−Vth). This enables reliable cut-off of transfer transistors at the time of the data erasion. Accordingly, even if the potential of the selective gates increases in accordance with an increase in the substrate potential of a memory cell portion, current leakage through the transistors can be prevented, thereby preventing breakage of the oxide films of transistors which constitute the selective gates.

Further, at the time of erasing data, the common gate lines are set to a voltage slightly higher than Vss (0 V). This can remarkably enhance the cut-off characteristics of transfer transistors included in a non-selected block. Specifically, setting the voltage of the common gate lines set to a voltage slightly higher than Vss (0 V) makes the source potential of each transfer transistor slightly higher than Vss (0 V). Since in this case, the gate potential of the transfer transistor is 0 V, and the substrate of the same (which is separated from the well of the memory cell portion) is 0 V, the transfer transistor can have substantially the same cut-off characteristics as a transistor which is in a state in which the substrate bias is set to a slightly negative voltage and its gate to the slightly negative voltage, too. Thus, leakage of current through the transfer transistor can be prevented.

Alternatively, the gate voltage of each transfer transistor included in a selected block may be set to substantially the same value as the threshold voltage thereof. This voltage must not be set to a value higher than needed. It suffices if the voltage enables the control gate to be set to 0 V. As a result, the charges of the selective gates in the selected block can be prevented from leaking at the time of data erasion.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 1 is a block diagram, showing a first embodiment of the invention;

FIG. 2 is a circuit diagram, showing a NAND-cell type EEPROM which is part of the FIG. 1 embodiment;

FIG. 3A is a block diagram, showing a second embodiment of the invention;

FIG. 3B is a view, useful in explaining the operation of the second embodiment;

FIG. 4 is a block diagram, showing a third embodiment of the invention;

FIG. 6 is a circuit diagram, showing a DINOR cell type EEPROM according to a fifth embodiment;

DETAILED DESCRIPTION OF THE PREFERRED EMBODIMENTS

Figure 5:
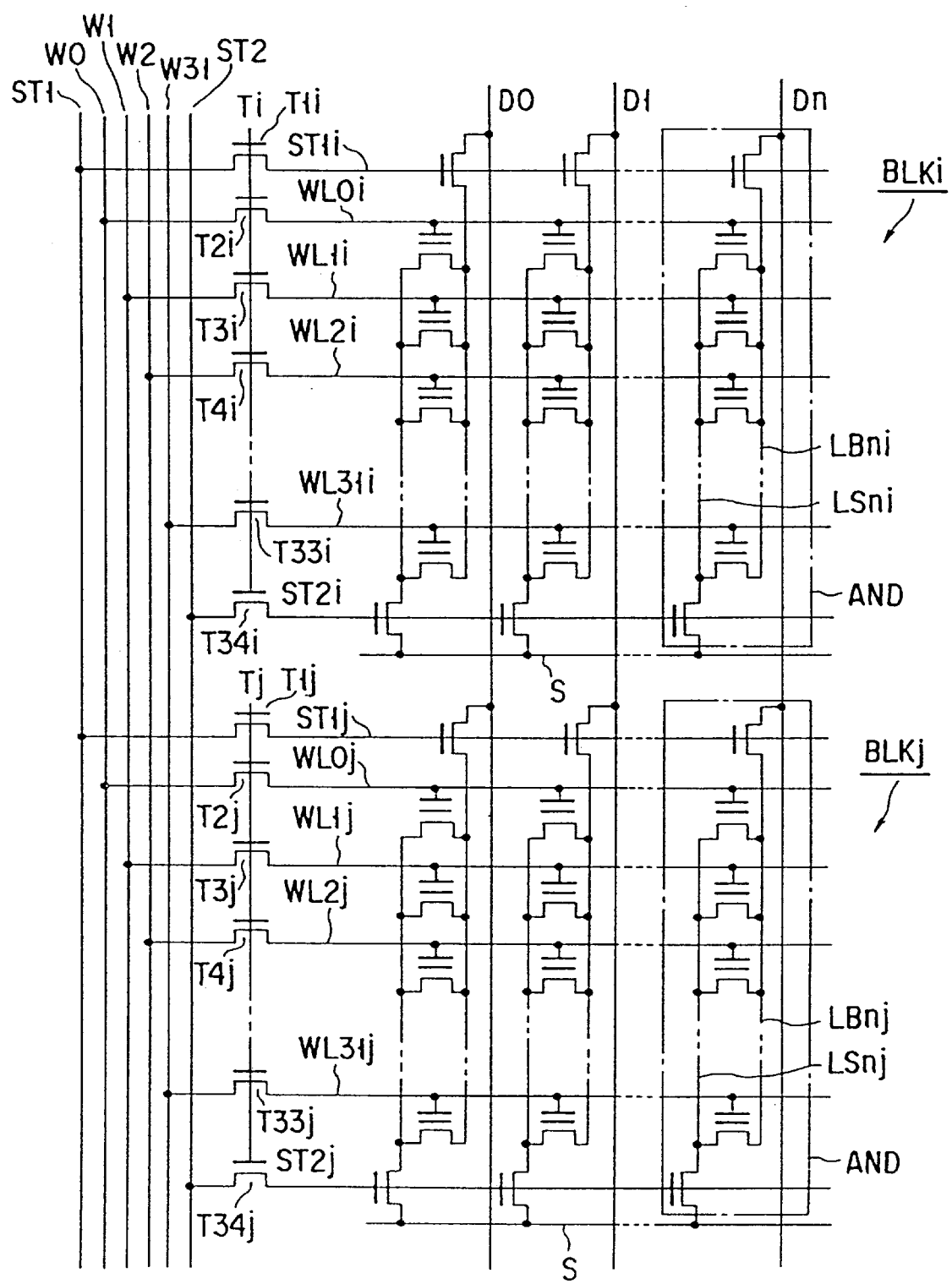
FIG. 5 is a circuit diagram, showing an AND cell type EEPROM according to a fourth embodiment.
Figure 7:
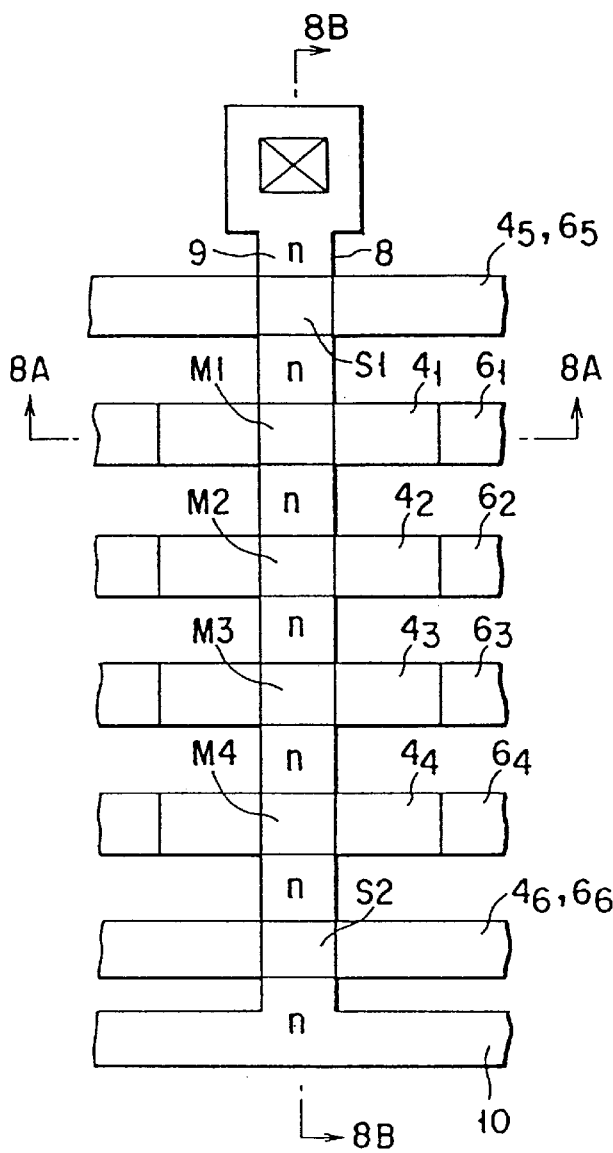
FIG. 7 is a plan view, showing a conventional NAND-cell type EEPROM.
Figure 9:
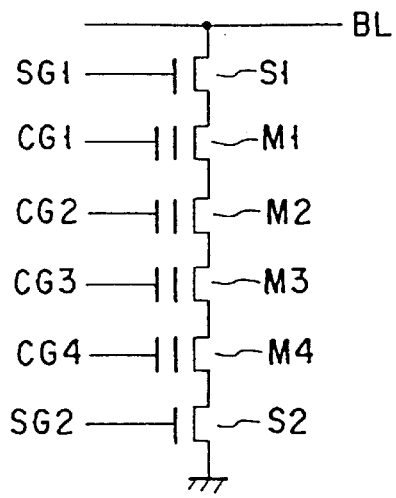
FIG. 9 is a diagram, showing a circuit equivalent to the FIG. 7 cell.
Figure 10:
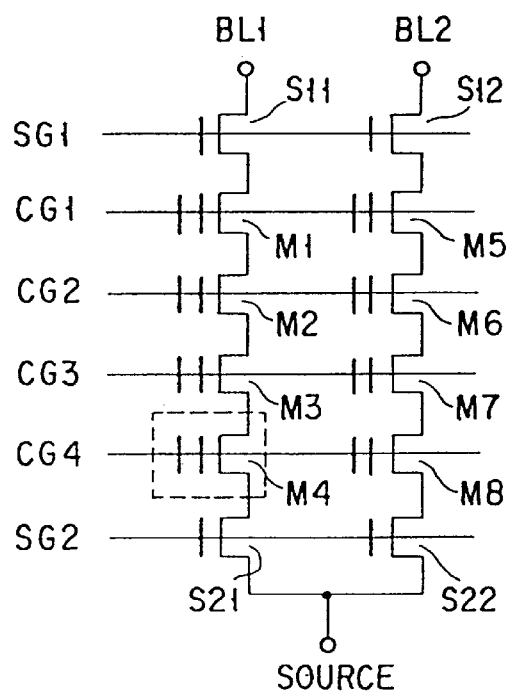
FIG. 10 is a diagram, showing a circuit equivalent to two FIG. 9 cells.
Figure 8A:
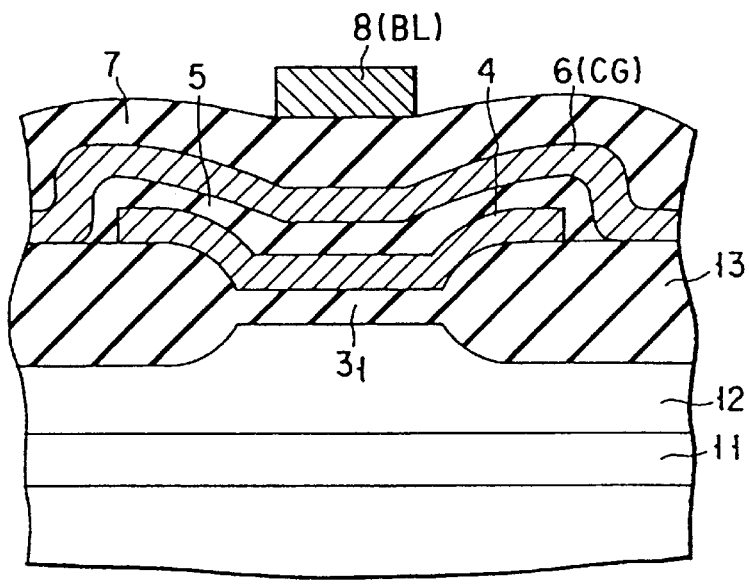
FIG. 8A is a view, taken along lines 8A—8A in FIG. 7.
Figure 8B:
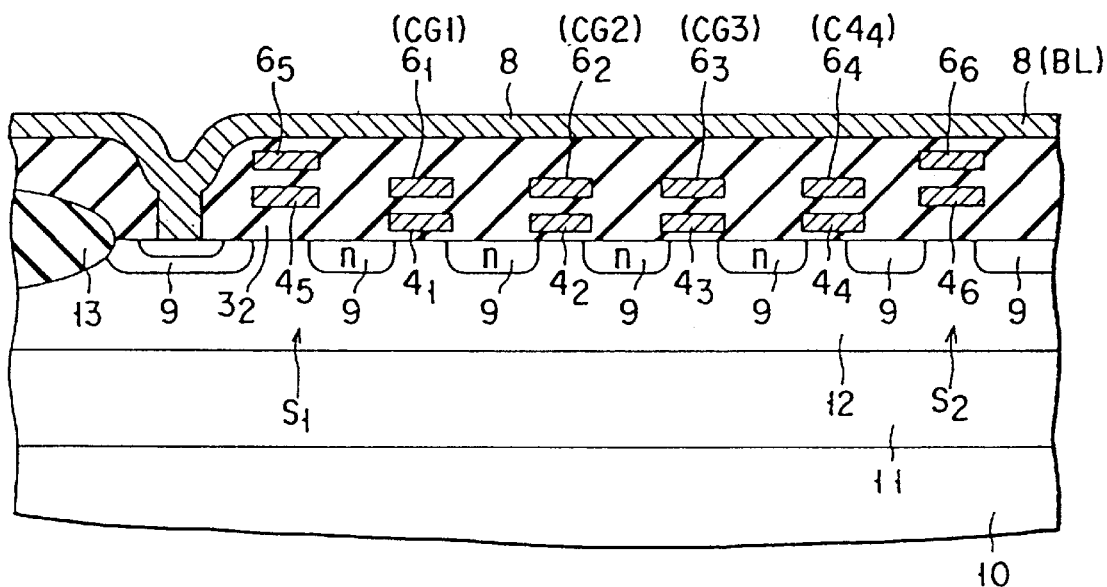
FIG. 8B is a view, taken along lines 8B—8B in FIG. 7.
Figure 11:
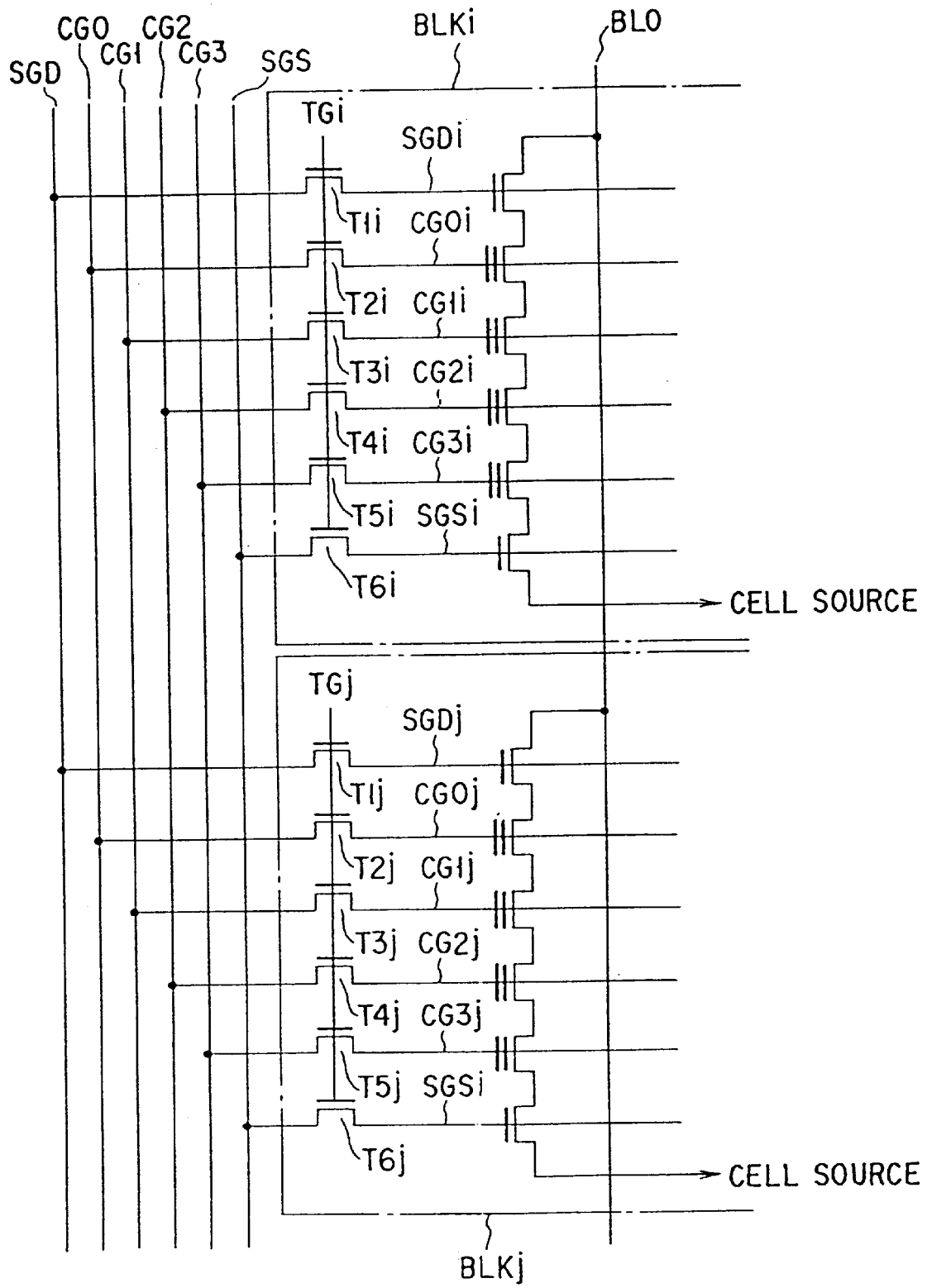
FIG. 11 is a conventional circuit, useful in explaining erasion performed in units of a block.

The embodiments of the invention will be explained with reference to the accompanying drawings.

FIG. 1 is a block diagram, showing a non-volatile semiconductor device. In FIG. 1, a memory cell array 21 comprises a plurality of NAND-cell type EEPROMs arranged in the form of a matrix and divided into a plurality of blocks. First and second row decoders 22 and 23 for selecting one of rows are arranged along the memory cell array 21. Further, first and second column decoders 26 and 27 for selecting one of columns via sense amplifiers 24 and 25, respectively, are arranged along the memory cell array 21. The first row decoder 22 is responsive to an address signal (not shown) for selecting a control gate included as a word line in a block with an odd number, for example. On the other hand, the second row decoder 23 is responsive to the address signal for selecting a control gate included as a word line in a block with an even number, for example. Further, the first column decoder 26 is responsive to the address signal for selecting, for example, a bit line with an odd number, while the second column decoder 27 is responsive to the address signal for selecting, for example, a bit line with an even number. Thus, the two row decoders are arranged in the row direction of the memory cell array, and the two column decoders in the column direction. This structure enables the circuit pattern constituting the row and column decoders to be formed with a wide pitch. This structure is effectively applied to a memory array with a capacity of 64 Mbits or more. In the case of 32 Mbits or less, it suffices if a single row decoder and a single column decoder are arranged in row and column directions, respectively, as in the conventional case.

A booster circuit 28 is provided in the vicinity of the first row decoder 22. The booster circuit 28 boosts a power voltage applied from the outside of the chip, to thereby generate a voltage necessary for data writing or erasion. Further, the booster circuit 28 is responsive to an address signal (not shown) for generating transfer gate signals TGi and TGj to select one of the blocks included in the memory cell array. The voltage generated by the booster circuit 28 is applied to the first and second row decoders 22 and 23. First and second peripheral circuits 29 and 30 are connected to the first and second column decoders 26 and 27, respectively. The first and second peripheral circuits 29 and 30 perform input/output of data, and generate, in response to an address signal (not shown), common gate signals SGD and SGS for controlling the selective gate of each NAND-cell type EEPROM. The common gate signals SGD and SGS are supplied to each NAND-cell type EEPROM via the first and second decoders 22 and 23.

FIG. 2 is a circuit diagram, showing a more specific structure of the FIG. 1 memory cell array. In this case, only two blocks are shown to facilitate the explanation. A first block BLKi includes a plurality of NAND cells. In each NAND cell, a plurality of EEPROMs have their sources and drains connected in series. The drain of an EEPROM located at a column-directional end of each NAND cell is connected to a corresponding one of bit lines BL0–BL2047 via its selective gate transistor, while the source of an EEPROM located at the other column-directional end of the NAND cell is connected to a common source line (cell source) via its selective gate transistor. The control gates CG0i–CG15i of the EEPROMs of the block BLKi are connected to common gate lines CG0–CG15 via transfer transistors T2i–T17i, respectively. The selective gate SGDi of the selective gate transistor is connected to the common gate line SGD via a transfer transistor T1i, while the selective gate SGSi of the selective gate transistor is connected to the common gate line SGS via a transfer transistor T18i. The transfer gate signal TGi is supplied to the gates of the transfer transistors T1i–T18i.

On the other hand, the second block BLKj includes a plurality of NAND cells. In each NAND cell, a plurality of EEPROMs have their sources and drains connected in series. The drain of an EEPROM located at a column-directional end of each NAND cell is connected to a corresponding one of bit lines BL0–BL2047 via its selective gate transistor, while the source of an EEPROM located at the other column-directional end of the NAND cell is connected to a common source line (cell source) via its selective gate transistor. The control gates CG0j–CG15j of the EEPROMs of the block BLKj are connected to the common gate lines CG0–CG15 via transfer transistors T2j–T17j, respectively. The selective gate SGDj of the selective gate transistor is connected to the common gate line SGD via a transfer transistor T1j, while the selective gate SGSj of the selective gate transistor is connected to the common gate line SGS via a transfer transistor T18j. The transfer gate signal TGj is supplied to the gates of the transfer transistors T1j–T18j.

Table 3 shows the relationship between the potentials of the main nodes in FIG. 2. Referring to table 3, the operation of the first embodiment will be explained. Specifically, table 3 shows a case where the block BLKi is selected and data therein are erased, while the block BLKj is not selected and data therein are not erased.

TABLE 3

|  | BLOCK ERASE |
|---|---|
| BL0 | $V_{PP}$ |
| . | . |
| . | . |
| . | . |
| BL2047 | $V_{PP}$ |
| Cell-Source | $V_{PP}$ |
| SGD | $V_{CC}$, or $V_{CC}-V_{th}$ |
| CG0 | $V_{SS}$ (0V) |
| CG1 | $V_{SS}$ (0V) |
| CG2 | $V_{SS}$ (0V) |
| . | . |
| . | . |
| . | . |
| CG13 | $V_{SS}$ (0V) |
| CG14 | $V_{SS}$ (0V) |
| CG15 | $V_{SS}$ (0V) |
| SGS | $V_{CC}$, or $V_{CC}-V_{th}$ |
| TGi | $V_{CC}$ (5V) |
| TGj | $V_{SS}$ (0V) |

TABLE 3-continued

|  | BLOCK ERASE |
|---|---|
| P WELL | $V_{PP}$ |
| N WELL | $V_{PP}$ |
| P-TYPE SUBSTRATE | $V_{SS}$ (0V) |

To erase data in a memory cell, the booster circuit 28 sets the transfer gate signals TGi and TGj to Vcc (5 V) and Vss (0 V), respectively, generates a voltage Vss (0 V) to be used for erasion, and applies it to the common gate lines CG0–CG15. Moreover, the first and second peripheral circuits 29 and 30 generate a selective gate signal of Vcc or Vcc–Vth, and apply the signal to the common data lines SGD and SGS. Vcc represents a power voltage, for example, of 5 V, 3.3 V or a lower value. Vth represents substantially the same voltage as the threshold voltage of the transfer transistor. When the transfer gate signal TGi is Vcc (5 V), the transistors T2i–T17i are conductive, and the control gates CG0i–CG15i are charged with Vss (0 V) via the transistors T2i–T17i. Accordingly, when the p-well and n-well of the memory cell portion are set to a high voltage Vpp, data stored in the memory cells of the selected block BLKi are erased, and each of the memory cells is shifted to the state of data "1".

The transistors T1i and T18i are conductive before the p-well and n-well of the memory cell portion are set to Vpp. Therefore, the selective gates SGDi and SGSi are charged with Vcc–Vth. In other words, since the gates TGi of the transistors T1i and T18i are charged with Vcc, and their sources with Vcc or Vcc–Vth, the transistors T1i and T18i operate in a pentode operation region (in a saturated operation region) and are charged with Vcc–Vth. When the p-well and n-well of the memory cell portion increase to Vpp, the potential of the selective gates SGDi and SGSi increases as a result of capacity coupling with the p-well. However, when the potential of the selective gates SGDi and SGSi exceeds Vcc–Vth even by only a little, the transistors T1i and T18i are cut off, the nodes of the selective gates SGDi and SGSi are shifted to a floating state. As a result, when the p-well of the memory cell portion is shifted to Vpp, the selective gates SGDi and SGSi are substantially shifted to Vcc–Vth+Vpp. Since the selective gates are at Vcc–Vth+Vpp when the p-well of the memory cell portion is at Vpp, only Vcc–Vth is applied to the oxide film of each selective gate, which means that the oxide film will not be broken. The potentials of the drain, source and gate of each of the transistors T1i and T18i are Vcc–Vth+Vpp, Vcc (or Vcc–Vth), and Vcc, respectively. The potentials of the drain, source and gate of each of the transistors T1j–T18j in the non-selected block BLKj have substantially the same relationship as the above. In light of that the p-type substrate of the transfer gate is set at Vss, it is necessary to design such that the junction breakdown voltage between the drain and substrate of the transfer gate is set to Vcc–Vth+Vpp or more.

On the other hand, since the transfer gate signal TGj of the non-selected block BLKj is set at Vss (0 V), the transistors T1j–T18j are in a non-conductive state, and the control gates CG0j–CG15j and the selective gates SGDj–SGSj are in a floating state. Accordingly, when the p-well and n-well of the memory cell portion is increased to Vpp, the control gates CG0j–CG15j and the selective gates SGDj–SGSj increase substantially to Vpp as a result of capacity coupling with the p-well of the memory cell portion. Therefore, only a small electric field is generated between the p-well and floating gate of each memory cell in the non-selected block BLKj, and hence data stored therein is not erased. At this time, the drain, source and gate of each of the transistors T2j–T17j are set at Vpp, Vss and Vss, respectively, while the drain, source and gate of the transistors T1j and T18j are set at Vpp and Vcc (or Vcc–Vth), respectively.

Table 4 shows the relationship in potential between the main nodes in FIG. 2 according to a second embodiment of the invention. The operation of the second embodiment will be explained with reference to table 4.

TABLE 4

| | BLOCK ERASE |
|---|---|
| BL0 | $V_{PP}$ |
| . | . |
| . | . |
| . | . |
| BL2047 | $V_{PP}$ |
| Cell-Source | $V_{PP}$ |
| SGD | $V_{CC}$, or $V_{CC}$-$V_{th}$ |
| CG0 | $V_L$ |
| CG1 | $V_L$ |
| CG2 | $V_L$ |
| . | . |
| . | . |
| . | . |
| CG13 | $V_L$ |
| CG14 | $V_L$ |
| CG15 | $V_L$ |
| SGS | $V_{CC}$, or $V_{CC}$-$V_{th}$ |
| TGi | $V_{CC}$ (5V) |
| TGj | $V_{SS}$ (0V) |
| P WELL | $V_{PP}$ |
| N WELL | $V_{PP}$ |
| P-TYPE SUBSTRATE | $V_{SS}$ (0V) |

An explanation will be given of a case where the block BLKi is selected and data therein are erased, while the block BLKj is not selected and data therein are not erased. As is shown in FIG. 3A, the booster circuit 28 sets the transfer gate signals TGi and TGj to Vcc (5 V) and Vss (0 V), respectively, generates a voltage $V_L$ higher than 0 V (e.g. 0.7 V), and supplies the voltage $V_L$ to the common gate lines CG0–CG15. The voltage $V_L$ is generated using, for example, the threshold voltage of a transistor incorporated in the booster circuit 28, or by means of a voltage generator (not shown) consisting of a known circuit. When the common gate lines are set to 0 V or more, the transfer transistors T2j–T17j in the non-selected block are equivalently supplied with a negative substrate bias and a negative gate voltage. Accordingly, the cut-off characteristics of the transfer transistors are remarkably enhanced. More specifically, if the common gate lines are set to $V_L$=0.7 V, the source potential and gate voltage of each of the transistors T2j–T17j are set to 0.7 V and 0 V, respectively, and the p-type substrate (separated from the n-well of the memory cell portion) is set to 0 V, as is shown in FIG. 3B. Accordingly, the transistors T2j–T17j have cut-off characteristics equivalent to a transistor which is obtained by setting its source potential and gate voltage to 0 V and –0.7 V, respectively, and the p-type substrate to –0.7 V. Therefore, when the non-selected control gates CG0j–CG15j are increased to substantially Vpp as a result of capacity coupling with the p-well, the charges of the control gates CG0j–CG15j do not leak to the common gate lines CG0–CG15 via the transistors T2j–T17j. This means that the control gates CG0j–CG15j are efficiently bootstrapped, and that erroneous erasion of memory cell data in the non-selected block BLKj will not occur.

Although in the second embodiment, the common gate signals SGD and SGS are set to Vcc or Vcc–Vth, the common gate lines may be set to the voltage $V_L$, and the common gate signals SGD and SGS may be set in a "Vcc floating" state, as is shown in table 5. The "Vcc floating" state means that the common gate lines SGD and SGS are first set to Vcc, and then shifted to a floating state. Also in this case, the oxide film of the selective gate transistor is protected from breakage, and erroneous erasion of memory cell data can be prevented.

TABLE 5

| | BLOCK ERASE |
|---|---|
| BL0 | $V_{PP}$ |
| . | . |
| . | . |
| . | . |
| BL2047 | $V_{PP}$ |
| Cell-Source | $V_{PP}$ |
| SGD | $V_{CC}$ FLOATING |
| CG0 | $V_L$ |
| CG1 | $V_L$ |
| CG2 | $V_L$ |
| . | . |
| . | . |
| . | . |
| CG13 | $V_L$ |
| CG14 | $V_L$ |
| CG15 | $V_L$ |
| SGS | $V_{CC}$ FLOATING |
| TGi | $V_{CC}$ (5V) |
| TGj | $V_{SS}$ (0V) |
| P WELL | $V_{PP}$ |
| N WELL | $V_{PP}$ |
| P-TYPE SUBSTRATE | $V_{SS}$ (0V) |

Table 6 shows the relationship in potential between the main nodes in FIG. 2 according to a third embodiment of the invention. The operation of the third embodiment will be explained with reference to table 6.

TABLE 6

| | BLOCK ERASE |
|---|---|
| BL0 | $V_{PP}$ |
| . | . |
| . | . |
| . | . |
| BL2047 | $V_{PP}$ |
| Cell-Source | $V_{PP}$ |
| SGD | $V_{CC}$, or $V_{CC}$-$V_{th}$ |
| CG0 | $V_{SS}$ (0V) |
| CG1 | $V_{SS}$ (0V) |
| CG2 | $V_{SS}$ (0V) |
| . | . |
| . | . |
| CG13 | $V_{SS}$ (0V) |
| CG14 | $V_{SS}$ (0V) |
| CG15 | $V_{SS}$ (0V) |
| SGS | $V_{CC}$, or $V_{CC}$-$V_{th}$ |
| TGi | $V_{th}$ |
| TGj | $V_{SS}$ (0V) |
| P WELL | $V_{PP}$ |
| N WELL | $V_{PP}$ |
| P-TYPE SUBSTRATE | $V_{SS}$ (0V) |

An explanation will be given of a case where the block BLKi is selected and data therein are erased, while the block BLKj is not selected and data therein are not erased. As is shown in FIG. 4, the booster circuit 28 supplies the common gate lines CG0–CG15 with the voltage Vss (0 V) for erasing data, and sets the transfer gate signal TGi of the selected block to the voltage Vth or more. Vth is the threshold voltage of each of the transistors T2i–T17i. The first and second peripheral circuits 29 and 30 generate common gate signals SGD and SGS of Vcc or Vcc−Vth, and supply them to the common gate lines. The transistors T1i–T18i become conductive in response to the transfer gate signal TGi, and the control gates CG0i–CG15i are shifted to Vss (0 V). Thus, when the p-well and n-well of the memory cell portion is increased to the high voltage Vpp, data stored in the memory cells of the selected block BLKi are erased, and the memory cells are shifted to the data "1" state.

On the other hand, the transistors T1i and T18i are in the conductive state before the p-well and n-well of the memory cell portion is increased to the high voltage Vpp. Since, however, the transfer gate signal TGi is at Vth, the selective gate signals SGDi and SGSi are substantially at Vss. Accordingly, when the p-well and n-well of the memory cell portion increase to Vpp, the selective gate signals SGDi and SGSi also increase to Vpp.

Although the first through third embodiments employ NAND-cell type EEPROMs, the invention is not limited thereto, but also applies to AND-cell type or DINOR-cell type EEPROMs.

FIG. 5 is a block diagram, showing a case where the invention is applied to an AND-cell type EEPROM. In a first block BLKi, the control gates of EEPROMs which constitute an AND cell are connected to control gate lines WL0i–WL31i, respectively. The drain of each EEPROM included in the AND cell is connected to a local bit line LBni, and the source of the same to a local source line LSni. Each local bit line LBni is connected to a corresponding one of main bit lines D0–Dn via a corresponding selective gate transistor, and each local source line LSni is connected to a cell source line S via a corresponding selective gate transistor. The gates of the selective gate transistors are connected to selective gates ST1i and ST2i, respectively. The selective gates ST1i and ST2i are connected to common gate lines ST1 and ST2 via transfer transistors T1i and T34i, respectively. The control gate lines WL0i–WL31i are connected to common gate lines W0–W31 via transfer transistors T2i–T33i, respectively.

In a second block BLKj, the control gates of EEPROMs which constitute an AND cell are connected to control gate lines WL0j–WL31j, respectively. The drain of each EEPROM included in the AND cell is connected to a local bit line LBnj, and the source of the same to a local source line LSnj. Each local bit line LBnj is connected to a corresponding one of main bit lines D0–Dn via a corresponding selective gate transistor, and each local source line LSnj is connected to a cell source line S via a corresponding selective gate transistor. The gates of the selective gate transistors are connected to selective gates ST1j and ST2j, respectively. The selective gates ST1j and ST2j are connected to the common gate lines ST1 and ST2 via transfer transistors T1j and T34j, respectively. The control gate lines WL0j–WL31j are connected to the common gate lines W0–W31 via transfer transistors T2j–T33j, respectively.

Table 7 shows the relationship in potential between the main nodes in FIG. 5 according to the fourth embodiment of the invention. Table 7 shows a case where the block BLKi is selected and data therein are erased, while the block BLKj is not selected and data therein are not erased.

TABLE 7

|  | BLOCK ERASE |
| --- | --- |
| D0 | $V_{PP}$ |
| D1 | $V_{PP}$ |
| . | . |
| . | . |
| . | . |
| Dn | $V_{PP}$ |
| ST1 | $V_{CC}$ |
| W0 | $V_L$ |
| W1 | $V_L$ |
| W2 | $V_L$ |
| . | . |
| . | . |
| . | . |
| W31 | $V_L$ |
| ST2 | $V_{CC}$ |
| Ti | $V_{CC}$ (5V or 3.3V) |
| Tj | $V_{SS}$ |
| P WELL | $V_{PP}$ |
| N WELL | $V_{PP}$ |
| P-TYPE SUBSTRATE | $V_{SS}$ (0V) |
| S | $V_{PP}$ |

FIG. 6 is a block diagram, showing a case where the invention is applied to a DINOR-cell type EEPROM. The DINOR-cell type EEPROM has substantially the same structure as the AND-cell type EEPROM shown in FIG. 5, except that the former does not have the selective gate transistors connected to the local source lines LSni, the transfer transistors T34i, T34j and the common gate line ST2. Accordingly, the DINOR-cell type EEPROM operates similar to the AND-cell type EEPROM.

What is claimed is:

1. A non-volatile semiconductor memory device comprising:
   a memory cell array having a plurality of memory cell units arranged in the form of a matrix, each of the memory cell units including a plural of memory cells connected to each other and, a first selective gate for connecting the memory cell unit to a bit line and a second selective gate for connecting the memory cell unit to a source line, the memory cells having respective control gates, wherein the control gates arranged in the same row are connected to each other;
   a plurality of first common gate lines for applying a predetermined voltage to the control: gates;
   a second common gate line for applying a predetermined voltage to the first selective gate;
   a third common gate line for applying a predetermined voltage to the second selective gate;
   first transfer gates each having a first terminal connected to one of the control gates and a second terminal connected to a corresponding one of the first common gate lines, wherein each of said first transfer gates connects said one of the control gates to said corresponding one of the first common gate lines in response to a control signal;
   a second transfer gate having a first terminal connected to the first selective gate and a second terminal connected to the second common gate line, wherein said second transfer gate connects the selective gate to the second common gate line in response to the control signal;
   a third transfer gate having a first terminal connected to the second selective gate and a second terminal connected to the third common gate line, wherein said third transfer gate connects the second selective gate to the third common gate line in response to the control signal;

a row selection circuit for supplying the control signal to the first, second, and third transfer gates for selecting the control gates and the first and second selective gate of each memory cell unit;

a column selection circuit for selecting the bit lines; and a first voltage generation circuit for applying, to the second and third common gate lines, one of a power supply voltage and a voltage lower than the power supply voltage by a threshold voltage of the first and second transfer gates, at the time of erasing data stored in the memory cells, wherein the memory cell units and the first and second selective gates are arranged in a well region, and a voltage greater than the power supply voltage is applied to the well region at the time of erasing data stored in the memory cells.

2. The device according to claim 1, further comprising a second voltage generation circuit for generating a ground voltage at the time of erasing data stored in the memory cells, and applying the ground voltage to the first common gate lines.

3. The device according to claim 1, further comprising a second voltage generation circuit for applying the power supply voltage to the first and second transfer gates at the time of erasing data stored in the memory cells.

4. The device according to claim 1, wherein the memory cell units are NAND-cell type EEPROMs.

5. The device according to claim 1, wherein the memory cell units are AND-cell type EEPROMs.

6. The device according to claim 1, wherein the memory cell units are DINOR-cell type EEPROMs.

7. A non-volatile semiconductor memory device comprising:

a memory cell array having a plurality of memory cell units arranged in the form of a matrix, each of the memory cell units including a plurality of memory cells connected to each other and a selective gate for connecting the memory cell unit to a bit line, the memory cells having respective control gates, wherein the control gates arranged in the same row are connected to each other;

a plurality of first common gate lines for applying a predetermined voltage to the control gates;

a second common gate line for applying a predetermined voltage to the selective gate;

first transfer gates each having a first terminal connected to one of the control gates and a second terminal connected to a corresponding one of the first common gate lines, wherein each of said first transfer gates connects said one of the control gates to said corresponding one of the first common gate lines in response to a control signal;

a second transfer gate having a first terminal connected to the selective gate and a second terminal connected to the second common gate line, wherein said second transfer gate connects the selective gate to the second common gate line in response to the control signal;

a row selection circuit for supplying the control signal to the first and second transfer gates for selecting the control gates and the selective gate of each memory cell unit;

a column selection circuit for selecting the bit lines; and a first voltage generation circuit for generating a voltage greater than or equal to a threshold voltage of the first transfer gates, and applying the generated voltage to gates of the first and second transfer gates, at the time of erasing data stored in the memory cells, wherein the memory cell units and the selective gate are arranged in a well region, and a voltage greater than a power supply voltage is applied to the well region at the time of erasing data stored in the memory cells.

8. The device according to claim 7, further comprising a second voltage generation circuit for generating one of the power supply voltage and a voltage lower than the power supply voltage by the threshold voltage of the first and second transfer gates, applying the generated voltage to the second common gate line, and generating a ground voltage and applying the ground voltage to the first common gate lines, at the time of erasing data stored in the memory cells.

9. A non-volatile semiconductor memory device comprising:

a memory cell array having at least first and second blocks, the first block including a plurality of first memory cell units arranged in a row direction, the first memory cell units including a plurality of first memory cells connected to each other and a first selective gate for connecting the first memory cell unit to a bit line, the first memory cells having respective first control gates, wherein the first control gates arranged in the same row are connected to each other, and the second block including a plurality of second memory cell units arranged in the row direction, the second memory cell units including a plurality of second memory cells connected to each other and a second selective gate for connecting the second memory cell unit to the bit line, the second memory cells having respective second control gates, wherein the second control gates arranged in the same row are connected to each other;

a plurality of first common gate lines for applying a predetermined voltage to the first and second control gates of the first and second blocks, said first common gate lines being shared by the first and second blocks;

a second common gate line for applying a predetermined voltage to the first and second selective gates of the first and second blocks, said second common gate line being shared by the first and second blocks;

first transfer gates each having a first terminal connected to one of the first control gates and a second terminal connected to a corresponding one of the first common gate lines, wherein each of said first transfer gates connects said one of the first control gates to said corresponding one of the first common gate lines in response to a first control signal;

a second transfer gate having a first terminal connected to the first selective gate and a second terminal connected to the second common gate line, wherein said second transfer gate connects the first selective gate to the second common gate line in response to the first control signal;

third transfer gates each having a first terminal connected to one of the second control gates and a second terminal connected to a corresponding one of the first common gate lines, wherein each of said third transfer gates connects said one of the second control gates to said corresponding one of the first common gate lines in response to a second control signal having a voltage different from a voltage of the first control signal;

a fourth transfer gate having a first terminal connected to the second selective gate and a second terminal connected to the second common gate line, wherein said fourth transfer gate connects the second selective gate to the second common gate line in response to the second control signal;

a row selection circuit for supplying the first control signal to the first and second transfer gates and the second control signal to the third and fourth transfer gates, to select one of the first and second blocks, and to select the first and second control gates and the first and second selective in the selected one of the first and second blocks;

a column selection circuit for selecting the bit lines; and a first voltage generation circuit for generating a voltage greater than or equal to a threshold voltage of the first and third transfer gates, and applying the generated voltage to gates of the transfer gates included in the selected one of the first and second blocks at the time of erasing data stored in the memory cells, wherein the first and second memory cell units and the first and second selective gates are arranged in a well region, and a voltage greater than the power supply voltage is applied to the well region at the time of erasing data stored in the memory cells.

10. The device according to claim 9, further comprising a second voltage generation circuit for generating a ground voltage at the time of erasing data stored in the memory cells, and applying the ground voltage to the first common gate lines.

11. The device according to claim 9, wherein the memory cell units are NAND-cell type EEPROMs.

12. The device according to claim 9, wherein the memory cell units are AND-cell type EEPROMs.

13. The device according to claim 9, wherein the memory cell units are DINOR-cell type EEPROMs.

14. A non-volatile semiconductor memory device comprising:

a memory cell array having at least first and second blocks, the first block including a plurality of first memory cell units arranged in a row direction, the first memory cell units including a plurality of first memory cells connected to each other and a first selective gate for connecting the first memory cell unit to a bit line, the first memory cells having respective first control gates, wherein the first control gates arranged in the same row are connected to each other, and the second block including a plurality of second memory cell units arranged in the row direction, the second memory cell units including a plurality of second memory cells connected to each other and a second selective gate for connecting the second memory cell unit to the bit line, the second memory cells having respective second control gates, wherein the second control gates arranged in the same row are connected to each other;

a plurality of first common gate lines for applying a predetermined voltage to the first and second control gates of the first and second blocks, said first common gate lines being shared by the first and second blocks;

a second common gate line for applying a predetermined voltage to the first and second selective gates of the first and second blocks, said second common gate line being shared by the first and second blocks;

first transfer gates each having a first terminal connected to one of the first control gates and a second terminal connected to a corresponding one of the first common gate lines, wherein each of said first transfer gates connects said one of the first control gates to said corresponding one of the first common gate lines in response to a first control signal;

a second transfer gate having a first terminal connected to the first selective gate and a second terminal connected to the second common gate line, wherein said second transfer gate connects the first selective gate to the second common gate line in response to the first control signal;

third transfer gates each having a first terminal connected to one of the second control gates and a second terminal connected to a corresponding one of the first common gate lines, wherein each of said third transfer gates connects said one of the second control gates to said corresponding one of the first common gate lines in response to a second control signal having a voltage different from a voltage of the first control signal;

a fourth transfer gate having a first terminal connected to the second selective gate and a second terminal connected to the second common gate line, wherein said fourth transfer gate connects the second selective gate to the second common gate line in response to the second control signal;

a row selection circuit for supplying the first control signal to the first and second transfer gates and the second control signal to the third and fourth transfer gates, to select one of the first and second blocks, and to select the first and second control gates and the first and second selective gates included in a selected one of the first and second blocks;

a column selection circuit for selecting the bit lines; and a first voltage generation circuit for generating one of a power supply voltage and a voltage lower than the power supply voltage by a threshold voltage of the second and fourth transfer gates, and applying the generated voltage to the second common gate line at the time of erasing data stored in the memory cells, wherein the first and second memory cell units and the first and second selective gates are arranged in a well region, and the voltage greater than the power supply voltage is applied to the well region at the time of erasing data stored in the memory cells.

15. The device according to claim 14, further comprising a second voltage generation circuit for generating a ground voltage at the time of erasing data stored in the memory cells, and applying the ground voltage to the first common gate lines.

16. A non-volatile semiconductor memory device comprising:

a memory cell array having a plurality of memory cell units arranged in the form of a matrix, each of the memory cell units including a plurality of memory cells connected to each other and a selective gate for connecting the memory cell unit to a bit line, the memory cells having respective control gates, wherein the control gates arranged in the same row are connected to each other;

a plurality of first common gate lines for applying a predetermined voltage to the control gates;

a second common gate line for applying a predetermined voltage to the selective gate;

first transfer gates each having a first terminal connected to one of the control gates and a second terminal connected to a corresponding one of the first common gate lines, wherein each of said first transfer gates connects said one of the control gates to said corresponding one of the first common gate lines in response to a control signal;

a second transfer gate having a first terminal connected to the selective gate and a second terminal connected to the second common gate line, wherein said second transfer gate connects the selective gate to the second common gate line in response to the control signal;

a row selection circuit for supplying the control signal to the first and second transfer gates for selecting the control gates and the selective gate of each memory cell unit;

a column selection circuit for selecting the bit lines; and a first voltage generation circuit for generating a voltage higher than a ground potential and not higher than a power supply voltage, and applying the generated voltage to one of the first and second common gate lines at the time of erasing data stored in the memory cells, wherein the memory cell units and the selective gate are arranged in a well region, and a voltage greater than the power supply voltage is applied to the well region at the time of erasing data stored in the memory cells.

17. A device according to claim 16, wherein the first voltage generation circuit generates a voltage between the power supply voltage and a voltage lower than the power supply voltage by a threshold voltage of the second transfer gate, and applies the generated voltage to the second common gate line.

18. A device according to claim 14, wherein the first voltage generation circuit generates a voltage higher than a ground potential and lower than the power supply voltage, and applies the generated voltage to the first common gate line.

19. A device according to claim 14, wherein the first control signal is set at the power supply voltage when the first block is selected.

20. A device according to claim 14, wherein the second control signal is set at the power supply voltage when the second block is selected.

21. A non-volatile semiconductor memory device comprising:

a memory cell array having a plurality of memory cell units arranged in the form of a matrix, each of the memory cell units including a plurality of memory cells connected to each other and a selective gate for connecting the memory cell unit to a bit line, the memory cells having respective control gates, wherein the control gate arranged in the same row are connected to each other;

a plurality of first common gate lines for applying a predetermined voltage to the control gates;

a second common gate line for applying a predetermined voltage to the selective gate;

first transfer gates each having a first terminal connected to one of the control gates and a second terminal connected to a corresponding one of the first common gate lines, wherein each of said first transfer gates connects said one of the control gates to said corresponding one of the first common gate lines in response to a control signal;

a second transfer gate having a first terminal connected to the selective gate and a second terminal connected to the second common gate line, wherein said second transfer gate connects the selective gate to the second common gate line in response to the control signal;

a row selection circuit for supplying the control signal to the first and second transfer gates for selecting the control gates and the selective gate of each memory cell unit;

a column selection circuit for selecting the bit lines; and a first voltage generation circuit for applying a positive voltage higher than a ground voltage and not higher than a power supply voltage, to the first common gate lines at the time of erasing data stored in the memory cells; wherein the positive voltage is equal to a threshold voltage of a transistor, wherein the memory cell units and the selective gate are arranged in a well region, and a voltage greater than the power supply voltage is applied to the well region at the time of erasing data stored in the memory cells.

22. The device according to claim 1, further comprising a second voltage generating circuit for generating a positive voltage greater than a ground voltage and not greater than the power supply voltage, and applying the positive voltage to the first common gate lines, at the time of erasing data stored in the memory cells.

23. The device according to claim 7, further comprising a second voltage generating circuit for generating a positive voltage greater than a ground voltage and not greater than the power supply voltage, and applying the positive voltage to the first common gate lines, at the time of erasing data stored in the memory cells.

24. The device according to claim 9, further comprising a second voltage generating circuit for generating a positive voltage greater than a ground voltage and not greater than the power supply voltage, and applying the positive voltage to the first common gate lines, at the time of erasing data stored in the memory cells.

25. The device according to claim 14, further comprising a second voltage generating circuit for generating a positive voltage greater than a ground voltage and not greater than the power supply voltage, and applying the positive voltage to the first common gate lines, at the time of erasing data stored in the memory cells.

26. The device according to claim 16, further comprising a second voltage generating circuit for generating a positive voltage greater than a ground voltage and not greater than the power supply voltage, and applying the positive voltage to the first common gate lines, at the time of erasing data stored in the memory cells.

27. The device according to claim 21, further comprising a second voltage generating circuit for generating a positive voltage greater than a ground voltage and not greater than the power supply voltage, and applying the positive voltage to the first common gate lines, at the time of erasing data stored in the memory cells.

28. A nonvolatile semiconductor memory device comprising:

a memory cell array having a plurality of memory cell units arranged in the form of a matrix, each of the memory cell units including a plurality of memory cells connected to each other and a first selective gate for connecting the memory cell unit to a bit line and a second selective gate for connecting the memory cell unit to a source line, the memory cells having respective control gates, wherein the control gates arranged in the same row are connected to each other;

a plurality of first common gate lines for applying a predetermined voltage to the control gates;

a second common gate line for applying a predetermined voltage to the first selective gate;

a third common gate line for applying a predetermined voltage to the second selective gate;

first transfer gates each having a first terminal connected to one of the control gates and a second terminal connected to a corresponding one of the first common gate lines, wherein each of said first transfer gates connects said one of the control gates to said corresponding one of the first common gate lines in response to a control signal;

a second transfer gate having a first terminal connected to the first selective gate and a second terminal connected to the second common gate line, wherein said second transfer gate connects the first selective gate to the second common gate line in response to the control signal;

a third transfer gate having a first terminal connected to the second selective gate and a second terminal connected to the third common gate line, wherein said third transfer gate connects the second selective gate to the third common gate line in response to the control signal;

a row selection circuit for supplying the control signal to the first, second and third transfer gates for selecting the control gates and the first and second selective gates of each memory cell unit;

a column selection circuit for selecting the bit lines; and a first voltage generation circuit for generating a voltage greater than or equal to a threshold voltage of the first transfer gates, and applying the generated voltage to gates of the first, second and third transfer gates, at the time of erasing data stored in the memory cells, wherein the memory cell units and the first and second selective gates are arranged in a well region, and a voltage greater than the power supply voltage is applied to the well region at the time of erasing data stored in the memory cells.

29. A non-volatile semiconductor memory device comprising:

a memory cell array having a plurality of memory cell units arranged in the form of a matrix, each of the memory cell units including a plurality of memory cells connected to each other and a first selective gate for connecting the memory cell unit to a bit line and a second selective gate for connecting the memory cell unit to a source line, the memory cells having respective control gates, wherein the control gates arranged in the same row are connected to each other;

a plural of first common gate lines for applying a predetermined voltage to the control gates;

a second common gate line for applying a predetermined voltage to the first selective gate;

a third common gate line for applying a predetermined voltage to the second selective gate;

first transfer gates each having a first terminal connected to one of the control gates and a second terminal connected to a corresponding one of the first common gate lines, wherein each of said first transfer gates connects said one of the control gates to said corresponding one of the first common gate lines in response to a control signal;

a second transfer gate having a first terminal connected to the first selective gate and a second terminal connected to the second common gate line, wherein said second transfer gate connects the first selective gate to the second common gate line in response to the control signal;

a third transfer gate having a first terminal connected to the second selective gate and a second terminal connected to the third common gate line, wherein said third transfer gate connects the second selective gate to the third common gate line in response to the control signal;

a row selection circuit for supplying the control signal to the first, second and third transfer gates for selecting the control gates and the first and second selective gates of each memory cell unit;

a column selection circuit for selecting the bit lines; and a first voltage generation circuit for generating a voltage higher than a ground potential and not higher than a power supply voltage, and applying the generated voltage to one of the first and second common gate lines at the time of erasing data stored in the memory cells, wherein the memory cell units and the first and second selective gates are arranged in a well region, and a voltage greater than a power supply voltage is applied to the well region at the time of erasing data stored in the memory cells.

30. A non-volatile semiconductor memory device comprising:

a memory cell array having a plurality of memory cell units arranged in the form of a matrix, each of the memory cell units including a plurality of memory cells connected to each other and a first selective gate for connecting the memory cell unit to a bit line and a second selective gate for connecting the memory cell unit to a source line, the memory cells having respective control gates, wherein the control gates arranged in the same row are connected to each other;

a plurality of first common gate lines for applying a predetermined voltage to the control gates;

a second common gate line for applying a predetermined voltage to the first selective gate;

a third common gate line for applying a predetermined voltage to the second selective gate;

first transfer gates each having a first terminal connected to one of the control gates and a second terminal connected to a corresponding one of the first common gate lines, wherein each of said first transfer gates connects said one of the control gates to said corresponding one of the first common gate lines in response to a control signal;

a second transfer gate having a first terminal connected to the first selective gate and a second terminal connected to the second common gate line, wherein said second transfer gate connects the first selective gate to the second common gate line in response to the control signal;

a third transfer gate having a first terminal connected to the second selective gate and a second terminal connected to the third common gate line, wherein said third transfer gate connects the second selective gate to the third common gate line in response to the control signal;

a row selection circuit for supplying the control signal to the first, second and third transfer gates for selecting the control gates and the first and second selective gates of each memory cell unit;

a column selection circuit for selecting the bit lines;

a first voltage generation circuit for applying a positive voltage higher than a ground voltage and not higher than a power supply voltage, to the first common gate lines at the time of erasing data stored in the memory cells, wherein the positive voltage is equal to a threshold voltage of a transistor; and a second voltage generating circuit for generating one of a power supply voltage and a voltage lower than the power supply voltage by a threshold voltage of the second and third transfer gates, and applying the generated voltage to the second and third common gate lines at the time of erasing data stored in the memory cells, wherein the memory cell units and the first and second selective gates are arranged in a well region, and a voltage greater than a power supply voltage is applied to the well region at the time of erasing data stored in the memory cells.

* * * * *

UNITED STATES PATENT AND TRADEMARK OFFICE
CERTIFICATE OF CORRECTION

PATENT NO.    : 6,240,022 B1
DATED         : May 29, 2001
INVENTOR(S)   : Koji Sakui et al.

It is certified that error appears in the above-identified patent and that said Letters Patent is hereby corrected as shown below:

<u>Column 14,</u>
Line 37, "plural" has been replaced with -- plurality --.
Line 45, "control:" has been replaced with -- control --.

<u>Column 15,</u>
Line 3, "gate" has been replaced with -- gates --.

<u>Column 17,</u>
Line 8, -- gates -- has been inserted after the word "selective".

<u>Column 21,</u>
Line 45, "plural" has been replaced with -- plurality --.

Signed and Sealed this

Eleventh Day of June, 2002

*Attest:*

JAMES E. ROGAN
*Director of the United States Patent and Trademark Office*

*Attesting Officer*